United States Patent
Lin

(10) Patent No.: US 8,723,542 B2
(45) Date of Patent: May 13, 2014

(54) TESTING JIG FOR POGO PIN CONNECTOR

(75) Inventor: Jui-pin Lin, New Taipei (TW)

(73) Assignee: Cheng Uei Precision Industry Co., Ltd., New Taipei (TW)

( * ) Notice: Subject to any disclaimer, the term of this patent is extended or adjusted under 35 U.S.C. 154(b) by 477 days.

(21) Appl. No.: 13/093,830

(22) Filed: Apr. 25, 2011

(65) Prior Publication Data

US 2012/0268154 A1  Oct. 25, 2012

(51) Int. Cl.
*G01R 31/02* (2006.01)
*G01R 1/067* (2006.01)

(52) U.S. Cl.
USPC ............ 324/755.05; 324/755.11; 324/756.04; 439/700

(58) Field of Classification Search
USPC ............................ 324/537–762; 439/626–700
See application file for complete search history.

(56) References Cited

U.S. PATENT DOCUMENTS

| | | | | |
|---|---|---|---|---|
| 5,109,597 | A * | 5/1992 | Elder et al. ...................... | 29/721 |
| 5,451,883 | A * | 9/1995 | Staab ........................ | 324/754.08 |
| 5,965,823 | A * | 10/1999 | Ryan et al. ...................... | 73/860 |
| 7,233,156 | B2 * | 6/2007 | Yanagisawa et al. .... | 324/755.02 |
| 8,337,256 | B1 * | 12/2012 | Lin ................................ | 439/700 |
| 8,525,525 | B2 * | 9/2013 | Sugiyama et al. ............ | 324/538 |
| 2006/0043989 | A1 * | 3/2006 | Ko ................................ | 324/755 |

* cited by examiner

*Primary Examiner* — Melissa Koval
*Assistant Examiner* — Emily Chan
(74) *Attorney, Agent, or Firm* — Cheng-Ju Chiang

(57) ABSTRACT

A testing jig of a pogo pin connector for testing a connection between at least one pogo pin and an electrical plug is disclosed. The testing jig includes a first support element, a second support element, and a platform. The first support element has a first groove and at least one opening defined therein. The second support element has a second groove corresponding to the first groove for receiving the electrical plug. The platform is disposed below the first support element, and at least one receiving hole is defined in the platform. The at least one pogo pin is disposed in the at least one receiving hole and exposed in the first groove through the at least one opening. The pogo pin is configured in various tilt angles through the platform with the opening for solving high cost of various mold developments.

9 Claims, 2 Drawing Sheets

TESTING JIG FOR POGO PIN CONNECTOR

FIELD OF THE INVENTION

The present invention relates to a testing jig, and especially to a testing jig for an audio jack connector with pogo pins.

BACKGROUND OF THE INVENTION

In a variety of electronic products (such as consumer computers, and communications), audio jack connectors are frequently utilized to connect headphone plugs or audio cables for achieving signal transmission. At present, a conventional audio jack connector employs a plurality of cantilever beams to serve as contact terminals for electrically coupling to an electrical plug. However, in order to reduce the size of the audio jack connector, U.S. Patent Application Publication No. 20100240259 revealed that a pogo pin connector is utilized to serve as an audio jack connector.

The pogo pin connector usually includes an insulated housing, a metallic pogo pin received in the insulation housing, and a compression spring. The metallic pogo pin includes a contact portion, which is exposed out of the insulation housing for electrical contact, and a base, which is utilized to push against the compression spring. One end of the compression spring is electrically coupled to a circuit board. When the metallic pogo pin is compressed, that is, when the electrical plug is inserted, the compression spring is pushed to achieve the objective of transmitting signals.

In the production of the audio jack connector with the pogo pins, engaging and separating force as well as stability of the signal transmission between the electrical plug and the audio jack connector need to be repeatedly tested, wherein the engaging and separating force as well as the stability of the signal transmission relate to disposed positions and angles of the metal pogo pins.

However, the problems can not be analyzed by software, and it will be costly to develop various molds to test in different parameters.

SUMMARY OF THE INVENTION

Accordingly, an objective of the present invention is to provide a testing jig of a pogo pin connector. The pogo pins can be configured to different title angles in the test jig, and the positions of the pogo pins can be changed through washers so as to test in various parameters, thereby solving the problem of high cost of the mold development.

To achieve the foregoing objectives, according to an aspect of the present invention, a testing jig of a pogo pin connector for testing a connection between at least one pogo pin and an electrical plug is provided. The testing jig includes a first support element, at least one opening, a second support element, a platform, and at least one receiving hole. The first support element has a first groove on an upper surface of the first support element, and the at least one opening is defined in the first groove. The second support element is disposed on the upper surface of the first support element, and the second support element has a second groove corresponding to the first groove for receiving the electrical plug. The first groove and the second groove form a cylindrical receiving space. In addition, the platform is disposed below the first support element, and the at least one receiving hole is defined in the platform. The at least one pogo pin is disposed in the at least one receiving hole and exposed in the first groove through the at least one opening.

More specifically, the receiving hole communicates with the opening. A predetermined angle is therebetween the electrical plug and a direction of the receiving hole in communicating with the opening, so that the predetermined angle is also therebetween the pogo pin and the electrical plug. Preferably, the predetermined angle is 90, 80, or 70 degrees.

On the other hand, the testing jig of the preferred embodiment further includes at least one washer, which disposed in the receiving hole, for adjusting a position of the at least one pogo pin exposed in the first groove. It is worth mentioning that the testing jig further includes a linking means for coupling the first support element, the second support element and the platform. Preferably, the linking means is an interlock means, and the testing jig further includes a plurality of screws and a pedestal for locking the first support element, the second support element and the platform. In other embodiments, the linking means is a gluing means or a welding means.

As mentioned above, according to the testing jig of the present invention, the pogo pin is configured in various tilt angles through the platform with the opening of the first support element. The positions of the pogo pin exposed in the first groove can be changed by the washer for testing in various parameters. Thus, the problems that the engaging and separating force as well as the stability of the signal transmission can not be analyzed by software, and the high cost of the various mold developments are solved.

It is to be understood that both the foregoing general description and the following detailed description of the present invention are exemplary and explanatory and are intended to provide further explanation of the invention as claimed.

DETAILED DESCRIPTION OF THE PREFERRED EMBODIMENTS

Figure 1:
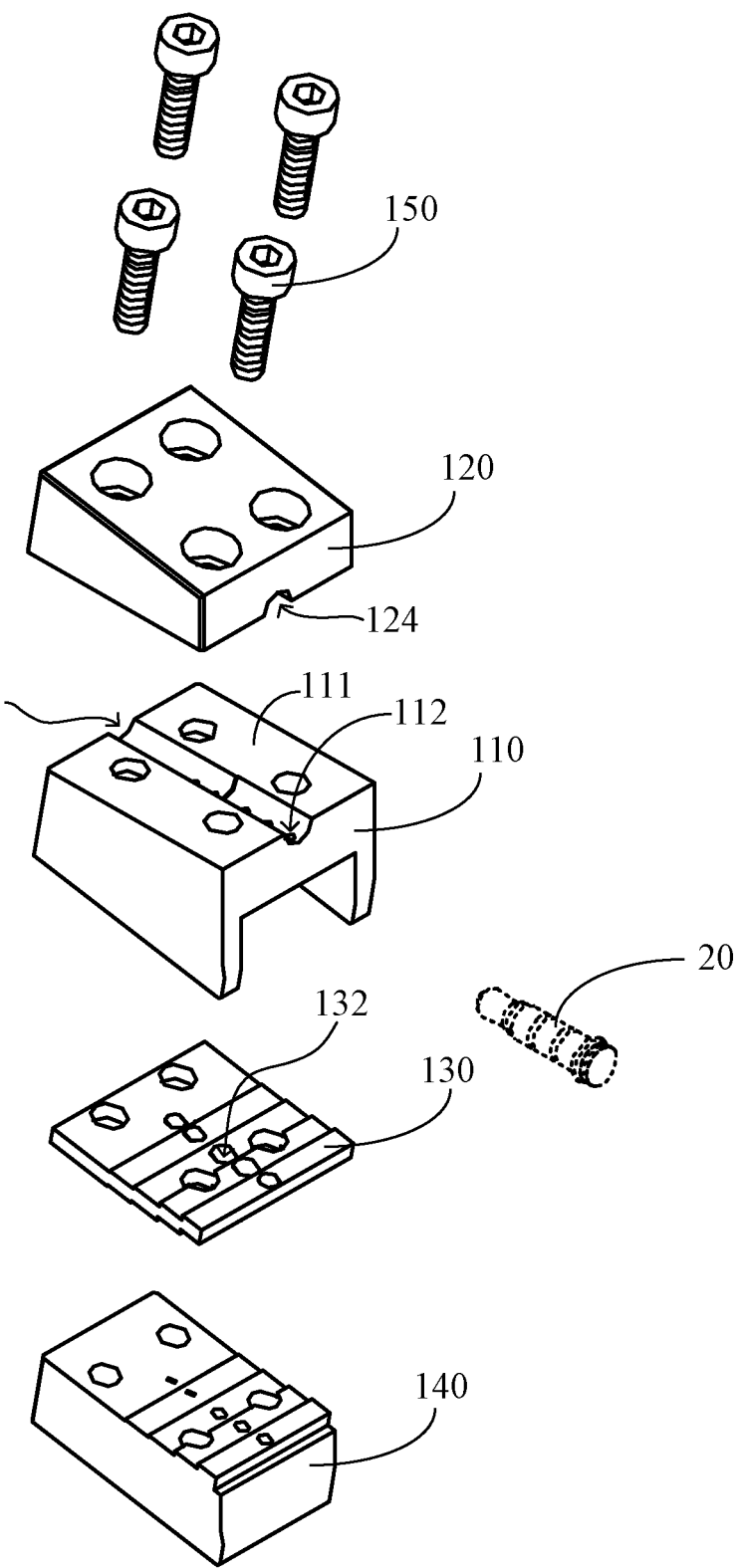
FIG. 1 is an exploded view illustrating a testing jig according to the preferred embodiment of the present invention.

The present invention will now be described in detail with reference to a preferred embodiment thereof as illustrated in the accompanying drawings. In different drawings, the same reference numbers will be used throughout the drawings to refer to the same or like parts. Referring to FIG. 1, FIG. 1 is an exploded view illustrating a testing jig according to the preferred embodiment of the present invention. The testing jig is utilized to test a connection between at least one pogo pin and an electrical plug. The testing jig according to the preferred embodiment the present invention is generally designated at 10. It should be noted that the electrical plug 20 is not in the scope of the testing jig 10 of the present invention, so the electrical plug 20 is designated as a headphone plug by dotted lines.

The testing jig 10 of the preferred embodiment of the present invention includes a first support element 110, at least one opening 112, a second support element 120, a platform 130, and at least one receiving hole 132, a pedestal 140, and a plurality of screws 150. The first support element 110 has a first groove 114 on an upper surface 111 of the first support element 110, and the at least one opening 112 is defined in the first groove 114. Specifically, the first groove 114 is a semi-cylindrical groove, and the opening 112 is a perforation in the first support element 110.

The second support element 120 is disposed on the upper surface 111 of the first support element 110, and the second support element 120 has a second groove 124 corresponding to the first groove 114 for receiving the electrical plug 20. Similarly, the second groove 124 is a semi-cylindrical groove and forms a cylindrical receiving space with the first groove 114

Figure 2A:
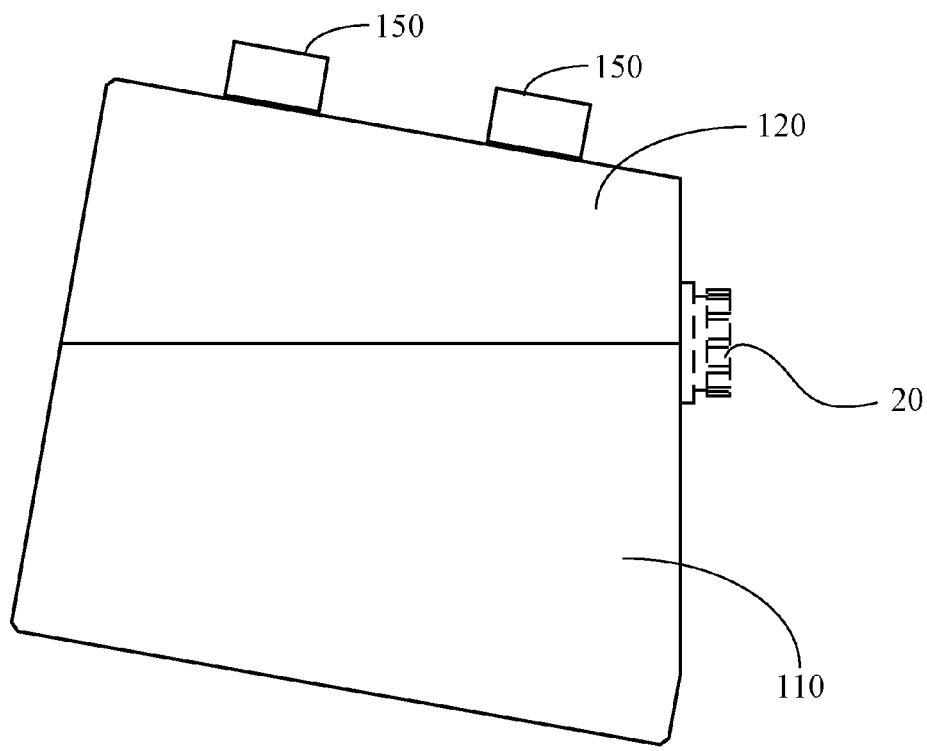
FIG. 2A is a side view illustrating the testing jig according to the preferred embodiment of the present invention.
Figure 2B:
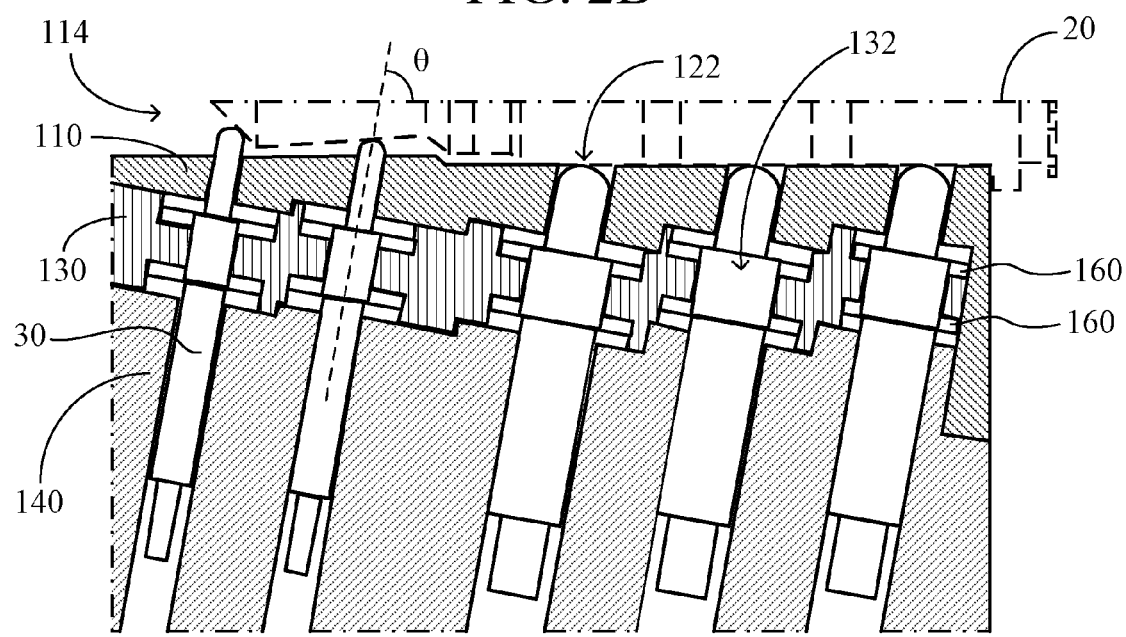
FIG. 2B is a partial cross-sectional view of FIG. 2A.

Referring to FIGS. 2A and 2B, FIG. 2A is a side view illustrating the testing jig 10 according to the preferred embodiment of the present invention. FIG. 2B is a partial cross-sectional view of FIG. 2A. The platform 130 is disposed below the first support element 110, and the at least one receiving hole 132 is defined in the platform 130. The at least one pogo pin 30 herein is disposed in the at least one receiving hole 132 and exposed in the first groove 114 through the at least one opening 122. Specifically, the receiving hole 132 is a perforation in the platform 130, and the receiving hole 132 communicates with the opening 112. In the preferred embodiment, there are five pogo pins 30 respectively engaged in five receiving holes 132, in which the contact portion of each pogo pin 30 is electrically coupled to a corresponding position of the electrical plug 20 for transmitting signals.

There is a predetermined angle θ between the electrical plug 20 and a direction of the receiving hole 132 in communicating with the opening 122, so that there is also the predetermined angle θ between the pogo pin 30 and the electrical plug 20. Similarly, the predetermined angle is 90, 80 or 70 degrees, but the present invention is not limited to be implemented in the aforesaid angles. Accordingly, the testing jig 10 achieves the objective that the pogo pin 30 can be tested in different angles to measure the engaging and separating force as well as the stability of the signal transmission.

In addition, the testing jig 10 of the preferred embodiment further includes at least one washer 160, which is disposed on the receiving hole 132, for adjusting a position of the pogo pin 130 exposed in the first groove 140. The engaging force between the pogo pin 30 and the electrical plug 20 can be adjusted by replacing the washers 160 located above and below the pogo pin 30. The more the pogo pin 30 protrudes, the larger is the engaging force. It is worth mentioning that the electrical plug 20 is coupled to a pull push tester (not shown for clarity) for executing pull and push repeatedly so as to acquire the best position of the pogo pin 30. Meanwhile, the best title angles of the pogo pin 30 also can be acquired, thereby getting best design parameters.

Referring to FIG. 1 again, the testing jig 10 further includes a linking means for coupling the first support element 110, the second support element 120 and the platform 130. In the embodiment, the linking means is an interlock means that the screws 150 and the pedestal 140 for locking the first support element 110, the second support element 120 and the platform 130. However, the present invention is not limited to be implemented in the interlock means using the screw 150. Other linking means such as a gluing means, welding means and so on can also be implemented.

In summary, according to the testing jig 10 of the present invention, the pogo pin is configured in various tilt angles through the platform with the opening 122 of the first support element. The positions of the pogo pin 30 exposed in the first groove 114 can be changed by the washer for testing in various parameters. Thus, the problems that the contact engaging and separating force as well as stability of the signal transmission can not be analyzed by software, and the high cost of the various mold developments are solved.

While the preferred embodiments of the present invention have been illustrated and described in detail, various modifications and alterations can be made by persons skilled in this art. The embodiment of the present invention is therefore described in an illustrative but not restrictive sense.

What is claimed is:

1. A testing jig of a pogo pin connector for testing a connection between at least one pogo pin and an electrical plug, the testing jig comprising:
   a first support element having a first groove on an upper surface of the first support element;
   at least one opening defined in the first groove;
   a second support element disposed on the upper surface of the first support element, and having a second groove corresponding to the first groove for receiving the electrical plug;
   a platform disposed below the first support element; and
   at least one receiving hole defined in the platform, wherein the at least one pogo pin is disposed in the at least one receiving hole and exposed in the first groove through the at least one opening, and wherein the receiving hole communicates with the opening, and wherein a predetermined angle is therebetween the electrical plug and a direction of the receiving hole in communicating with the opening, and the predetermined angle is therebetween the pogo pin and the electrical plug.

2. The testing jig of claim 1, wherein the first groove and the second groove form a cylindrical receiving space.

3. The testing jig of claim 1, wherein the predetermined angle ranges from 70 to 90 degrees.

4. The testing jig of claim 1, further comprising at least one washer disposed in the receiving hole for adjusting a position of the at least one pogo pin exposed in the first groove.

5. The testing jig of claim 1, further comprising a linking means for coupling the first support element, the second support element, and the platform.

6. The testing jig of claim 5, wherein the linking means is an interlock means.

7. The testing jig of claim 6, further comprising a plurality of screws and a pedestal for locking the first support element, the second support element and the platform.

8. The testing jig of claim 5, wherein the linking means is a gluing means.

9. The testing jig of claim 5, wherein the linking means is a welding means.

* * * * *